(12) United States Patent
Lee

(10) Patent No.: US 8,344,337 B2
(45) Date of Patent: Jan. 1, 2013

(54) SILABORANE IMPLANTATION PROCESSES

(75) Inventor: William Davis Lee, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 168 days.

(21) Appl. No.: 12/764,540

(22) Filed: Apr. 21, 2010

(65) Prior Publication Data

US 2011/0260047 A1 Oct. 27, 2011

(51) Int. Cl.
*G21G 5/00* (2006.01)
(52) U.S. Cl. ............... 250/492.3; 250/492.1; 250/492.21
(58) Field of Classification Search .................. None
See application file for complete search history.

(56) References Cited

U.S. PATENT DOCUMENTS

| | | | | |
|---|---|---|---|---|
| 5,306,921 A * | 4/1994 | Tanaka et al. | ............ | 250/492.21 |
| 5,492,862 A * | 2/1996 | Misumi | .......... | 438/516 |
| 5,661,308 A | 8/1997 | Benveniste et al. | | |
| 5,852,345 A * | 12/1998 | Armini | ............ | 315/111.81 |
| 5,898,178 A * | 4/1999 | Bunker | ............ | 250/423 R |
| 6,013,332 A | 1/2000 | Goto et al. | | |
| 6,107,634 A | 8/2000 | Horsky | | |
| 6,432,256 B1 * | 8/2002 | Raoux | ............ | 156/345.1 |
| 6,452,338 B1 | 9/2002 | Horsky | | |
| 6,479,828 B2 | 11/2002 | Perel | | |
| 6,525,224 B1 | 2/2003 | Spielvogel et al. | | |
| 6,958,481 B2 | 10/2005 | Horsky et al. | | |
| 7,185,602 B2 | 3/2007 | Horsky et al. | | |
| 7,514,337 B2 * | 4/2009 | Jeong | ............ | 438/424 |
| 7,521,356 B2 * | 4/2009 | Ramaswamy et al. | ........ | 438/627 |
| 7,943,507 B2 * | 5/2011 | Ramaswamy et al. | ........ | 438/627 |
| 2002/0074521 A1 * | 6/2002 | Perel | ............ | 250/492.21 |
| 2005/0208218 A1 * | 9/2005 | Becker et al. | ............ | 427/248.1 |
| 2006/0145095 A1 * | 7/2006 | Olson et al. | ............ | 250/492.21 |
| 2007/0037360 A1 * | 2/2007 | Jeong | ............ | 438/424 |
| 2007/0178678 A1 | 8/2007 | Hatem et al. | | |
| 2007/0178679 A1 | 8/2007 | Hatem et al. | | |
| 2007/0194252 A1 | 8/2007 | Horsky et al. | | |
| 2007/0215959 A1 * | 9/2007 | Lee et al. | ............ | 257/412 |
| 2008/0102026 A1 * | 5/2008 | Lee et al. | ............ | 424/1.11 |
| 2008/0105828 A1 * | 5/2008 | Hatem et al. | ............ | 250/426 |
| 2009/0206270 A1 * | 8/2009 | Glayish et al. | ........ | 250/396 ML |
| 2009/0314958 A1 * | 12/2009 | Tieger et al. | ............ | 250/492.2 |

* cited by examiner

*Primary Examiner* — David A Vanore
*Assistant Examiner* — Andrew Smyth
(74) *Attorney, Agent, or Firm* — Cantor Colburn LLP

(57) ABSTRACT

Methods for implanting an silaborane molecule or a selected ionized lower mass byproduct into a workpiece generally includes vaporizing and ionizing silaborane molecule in an ion source to create a plasma and produce silaborane molecules and its ionized lower mass byproducts. The ionized silaborane molecules and lower mass byproducts within the plasma are then extracted to form an ion beam. The ion beam is mass analyzed with a mass analyzer magnet to permit selected ionized silaborane molecules or selected ionized lower mass byproducts to pass therethrough and implant into a workpiece.

21 Claims, 7 Drawing Sheets

SILABORANE IMPLANTATION PROCESSES

BACKGROUND

The present disclosure generally relates to semiconductor ion implantation, and more specifically, to methods for selectively implanting silaborane molecules into semiconductor work pieces.

Ion implanters can be used to treat silicon wafers by bombardment of the wafers with an ion beam. One use of such beam treatment is to selectively implant the wafers with impurities and/or dopants of a controlled concentration for fabrication of integrated circuits.

A typical ion implanter includes an ion source, an ion extraction device, a mass analysis device, a beam transport device and a wafer processing device. The ion source generates ions of desired atomic or molecular species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, the semiconductor wafers are implanted with the atomic or molecular species or ionic fragments thereof in the wafer processing device.

Ion energy is used to control junction depth in semiconductor devices. The energy of the ions that make up the ion beam determines the degree of depth of the implanted ions. High energy processes such as those used to form retrograde wells in semiconductor devices require implants of up to a few million electron-volts (MeV), while shallow junctions may only demand energies below 1 thousand electron-volts (keV), and ultra-shallow junctions may require energies as low as 250 electron-volts (eV). Typically, high current implanters (generally greater than 10 milliamps (mA) ion beam current) are used for high dose implants, while medium current implanters (generally capable up to about 1 mA beam current) are used for lower dose applications.

The continuing trend to smaller and smaller semiconductor devices requires implanters with ion sources that continue to deliver higher beam currents at lower energies. The higher beam current provides the necessary dosage levels, while the lower energy levels permit shallow implants. Source/drain junctions in complementary metal-oxide-semiconductor (CMOS) devices, for example, require such high current, low energy applications.

Conventional ion sources utilize an ionizable dopant gas that is obtained either directly from a source of a compressed gas or indirectly from a vaporized solid. Typical source elements are boron (B), phosphorous (P), gallium (Ga), indium (In), antimony (Sb), and arsenic (As). Most of these source elements are commonly used in both solid and gaseous form, except boron, which is almost exclusively provided in gaseous form. In particular applications, there is a need for low energy and ultra low energy boron implants. "Space charge" effects, however, limit the current of atomic boron that can be transported at low energy to low values, thereby reducing ion implanter productivity.

A current method used to avoid the transmission losses and so called "space charge" effects brought about by low-energy ion beam transport utilizes molecules having more than one boron atom. Transporting more than one boron atom at the same time, with a single charge, essentially reduces the implant energy of each boron atom by one over the number of atoms being transported, while increasing the effective boron current by a factor of the number of atoms per molecule. This can be achieved by generating and extracting molecules of boron, or boron clusters, with almost any number of boron atoms.

In another method, the boron atom(s) can be transported as a molecule with different elements. Again, this reduces the effective implant energy for each boron atom by a factor proportional to the molecule's total mass. The added elements of the molecule. Ideally, the added elements will simply add mass to the boron-based molecule and not affect the outcome of the implant into the crystalline structure of the silicon substrate. For example, decaborane ($B_{10}H_{14}$) can be an excellent feed material for boron implants because each decaborane molecule ($B_{10}H_{14}$) when vaporized and ionized can provide a molecular ion comprised of ten boron atoms. Such a source is especially suitable for high dose/low energy implant processes used to create shallow junctions, because a molecular decaborane ion beam can implant ten times the boron dose per unit of current as can a monatomic boron ion beam. In addition, the hydrogen molecules are not thought to adversely affect the implants of the devices. Decaborane and other borohydrides, however, can be unstable at higher temperatures, such as those found in a standard ion source. As such, to use these molecules, other methods of ionization and beam generation must be implemented.

Still another method for delivering multiple boron atoms involves using molecules that have alternate materials configured to help stabilize the borane structure. One example is the use of carborane, specifically o-carborane ($C_2B_{10}H_{12}$), because the molecule is more robust and stable under the conditions found in a standard ion source. Carborane also remains stable during ionization, extraction, and transport to the wafer. The implants with this molecule, therefore, also get a dose of carbon that will modify that crystalline structure of the silicon substrate. This can be undesirable for applications in which it is important that the crystalline structure remain the same after implantation.

It would be desirable, therefore, to provide a stable boron molecule that can be implanted at low or ultra low energies without carrying any impurities to the wafer during implant.

BRIEF SUMMARY

Disclosed herein are processes for implanting silaborane molecules into a workpiece. In one embodiment, a process for implanting silaborane molecules, the process comprises vaporizing and ionizing silaborane molecules in an ion source to create a plasma and produce ionized silaborane molecules and ionized lower mass byproducts; extracting the ionized silaborane cluster molecules and ionized lower mass byproducts within the plasma through a source aperture to form an ion beam; mass analyzing the ion beam with a mass analyzer magnet to permit the ionized silaborane molecules or a selected ionized mass of the lower mass byproducts to pass therethrough; transporting drift of the ion beam and/or optionally applying additional acceleration or deceleration potentials to set the final energy; and implanting the ionized silaborane molecules or the selected ionized mass of the lower mass byproducts into a workpiece.

In another embodiment, a process for implanting boron atoms into a work piece comprises vaporizing an silaborane molecule; ionizing the silaborane molecule and extracting ions from an ion source to form an ion beam; transporting drift of the ion beam and/or optionally applying additional acceleration or deceleration potentials to set the final energy;

and implanting selected ions having a desired charge to mass ratio into the work piece, wherein the selected ions decompose into the carbon atoms.

These and other objects, advantages and features of the disclosure will become better understood from the detailed description of the disclosure that is described in conjunction with the accompanying drawings.

DETAILED DESCRIPTION

The present disclosure generally relates to a method of implanting ionized silaborane molecules or a selected ionized mass of one of its lower mass byproducts into a workpiece. The ionized silaborane molecules or the selected ionized mass of its lower mass byproducts are extracted, i.e., accelerated, from an ion source, mass analyzed, and implanted into the workpiece. The extracted ions may also go through additional acceleration, deceleration or focusing stages before it reaches the workpiece. Advantageously, the silaborane molecule as a source material for ion implantation provides molecule stability during ionization, thereby permitting the use of conventional ion sources. Moreover, the presence of silicon atoms rather than carbon atoms (i.e., with carborane) ensures that no contaminates are added to the crystalline structure of the substrate, e.g., silicon. Upon annealing, the silicon crystal will re-grow in the regions that were damaged by the implant. The boron atoms will take residence in the crystal providing the p-type dopant, while the silicon atoms will assume positions in the crystal lattice providing no change to the crystal.

Figure 1:
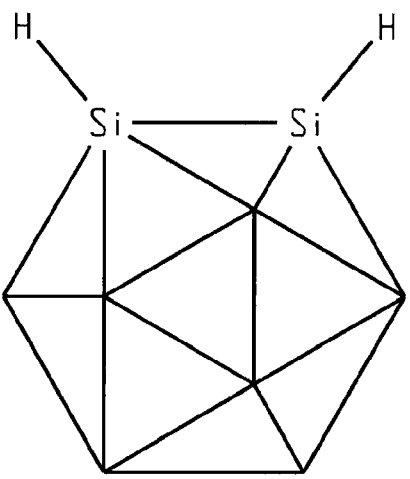
FIG. 1 provides a perspective view of an exemplary O-silaborane molecule of formula: $Si_2B_{10}H_{12}$, wherein positions 1 and 2 of the icosahedron are occupied by silicon atoms.
Figure 2:
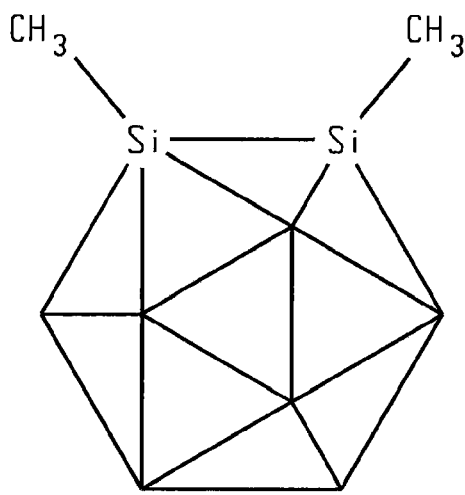
FIG. 2 provides a perspective view of 1,2 dimethyl 1,2 disila closo dodecaborane, wherein positions 1 and 2 of the icosahedron are occupied by silicon atoms and methyl groups are attached thereto.
Figure 3:
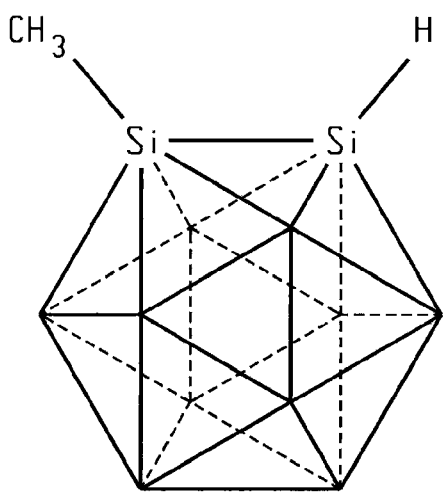
FIG. 3 provides a perspective view of 1 methyl 1,2 disila closo dodecaborane, wherein positions 1 and 2 of the icosahedron are occupied by silicon atoms and a methyl group is attached to position 1 and a hydrogen atom is attached to position two.

As used herein, the term "silaborane" generally refers to any of a class of compounds that have an icosahedral structure. The silaborane compounds comprise silicon and boron atoms and their structure provides a molecule stable enough to be used with a standard ionization source. In other words, the closed icosahedral structure provides excellent thermal stability of the molecule. Moreover, the substitution of silicon atoms for carbon in the structure, when compared to carborane, ensures that no contaminants are added to the crystal. One exemplary silaborane is the o-silaborane molecule of the formula: $Si_2B_{10}H_{12}$. The structure of o-silaborane is illustrated in FIG. 1. As seen in the figure, positions (vertices) 1 and 2 of the molecule are occupied by silicon atoms, each with a bound hydrogen. The ten remaining vertices of the icosahedron are occupied by a boron atom with a hydrogen atom bound thereto and extending outward. Another exemplary silaborane for use with a standard ionization source is 1,2 dimethyl 1,2 disila closo dodecaborane, the structure of which is shown in FIG. 2. This molecule is similar to o-silaborane, except the hydrogen atoms bound to the silicon atoms are replaced with methyl groups (—$CH_3$). During ionization in an arc chamber of an ion implanter, the less tightly bonded methyl groups are stripped from this molecule and the remaining o-silaborane icosahedron is transported to the silicon substrate for implant. Other exemplary icosahedral silaboranes can include, without limitation, compounds of the formula: $B_nH_nSi_{12-n}R_{12-n}$, where R is an atom or compound bound to the silicon atoms and n is an integer. Exemplary "R" compounds suitable for this formula can include, without limitation, hydrogen atoms, such as in o-silaborane, methyl groups, ethyl groups, phenyl groups. The silicon atoms may have the same or different compounds bound thereto. An exemplary embodiment of a silaborane having different R compounds bound thereto is 1 methyl 1,2 disila closo dodecaborane, the structure of which is shown in FIG. 3.

The silaborane molecules with icosahedral structure are most suitable as source materials for ion implantation because their icosahedral structure provides added stability in the ion source during ionization. Moreover, many of these compounds have relatively high vapor pressure and are stable at elevated temperatures as might be found in the various ionization sources used in ion implantation tools. The increased stability provided by the icosahedral structure eliminates the requirement for an elaborate "soft ionization" source to delicately remove electrons from the molecule so as to form the ionized molecules.

The silaborane molecules can be implanted using any ion implantation device such as those disclosed in U.S. Pat. Nos. 6,013,332; 6,107,634; 6,288,403; 6,958,481; 6,452,338; and 7,185,602. The ion beam produced by the particular ion implantation device may be configured as a spot beam mechanical scan, wherein the workpiece is mechanically scanned in two dimensions orthogonal to a generally stationary spot beam having an approximately circular cross-section of a particular diameter depending on the characteristics of the spot beam; a ribbon beam, wherein the beam is fixed in one direction across the workpiece while the workpiece is mechanically scanned in an orthogonal direction, and wherein the ribbon beam may have a large width/height aspect ratio and may be at least as wide as the workpiece; or an electromagnetically or electrostatically scanned beam that is scanned in one direction across a workpiece that is mechanically scanned in an orthogonal direction. An exemplary ion implantation device is the OPTIMA HD® ion implantation device commercially available from Axcelis Technologies, Inc, which is configured to provide a spot beam 2-dimensional mechanical scan.

Figure 4:
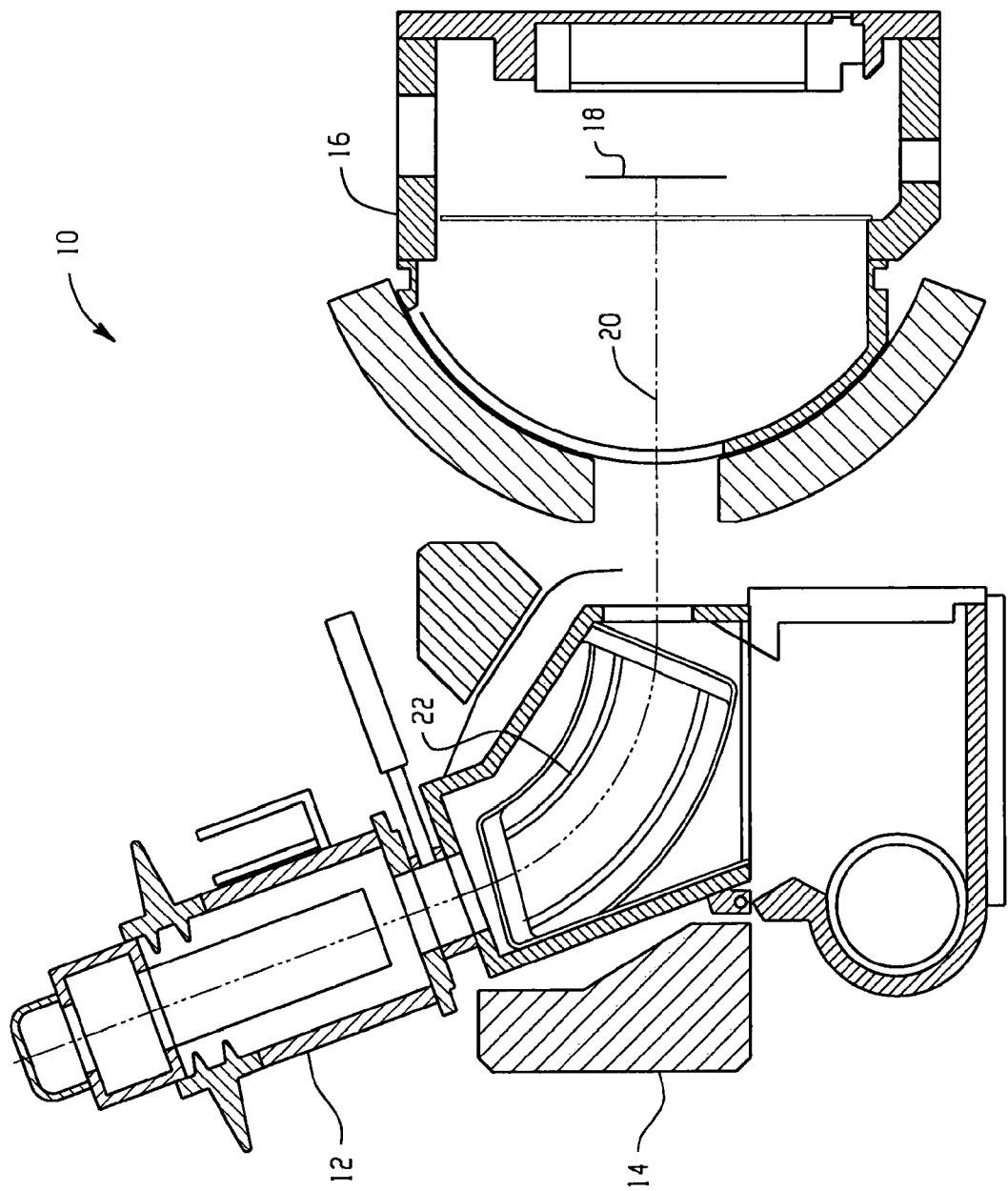
FIG. 4 schematically illustrates an exemplary ion implantation device.

FIG. 4 schematically illustrates an exemplary ion implantation device 10. The device generally includes an ion source 12, a beamline assembly 14, and a targeting chamber 16 housing a workpiece 18. The ion source 12 generates charged ions from a vaporized silaborane molecule that is subsequently extracted during operation to form an ion beam 20. The beamline assembly 14 includes a mass analyzer 22 formed at about a ninety degree angle and includes one or more magnets that serve to establish a (dipole) magnetic field therein. As the ion beam 20 enters the mass analyzer 22, it is correspondingly bent by the magnetic field such that undesired ions are deflected and the desired ions pass therethrough. Once through the mass analyzer, the ion beam may be accelerated, decelerated, focused or otherwise modified for implantation into the workpiece. In this manner, the ions that pass therethrough have a desired charge to mass ratio, which are subsequently implanted into the workpiece. During implantation of the ions having the desired charge to mass ratio, the workpiece can be mechanically scanned in two dimensions perpendicular to the ion beam. The entire path traversed by the ion beam 20 is under vacuum during implantation.

Figure 5:
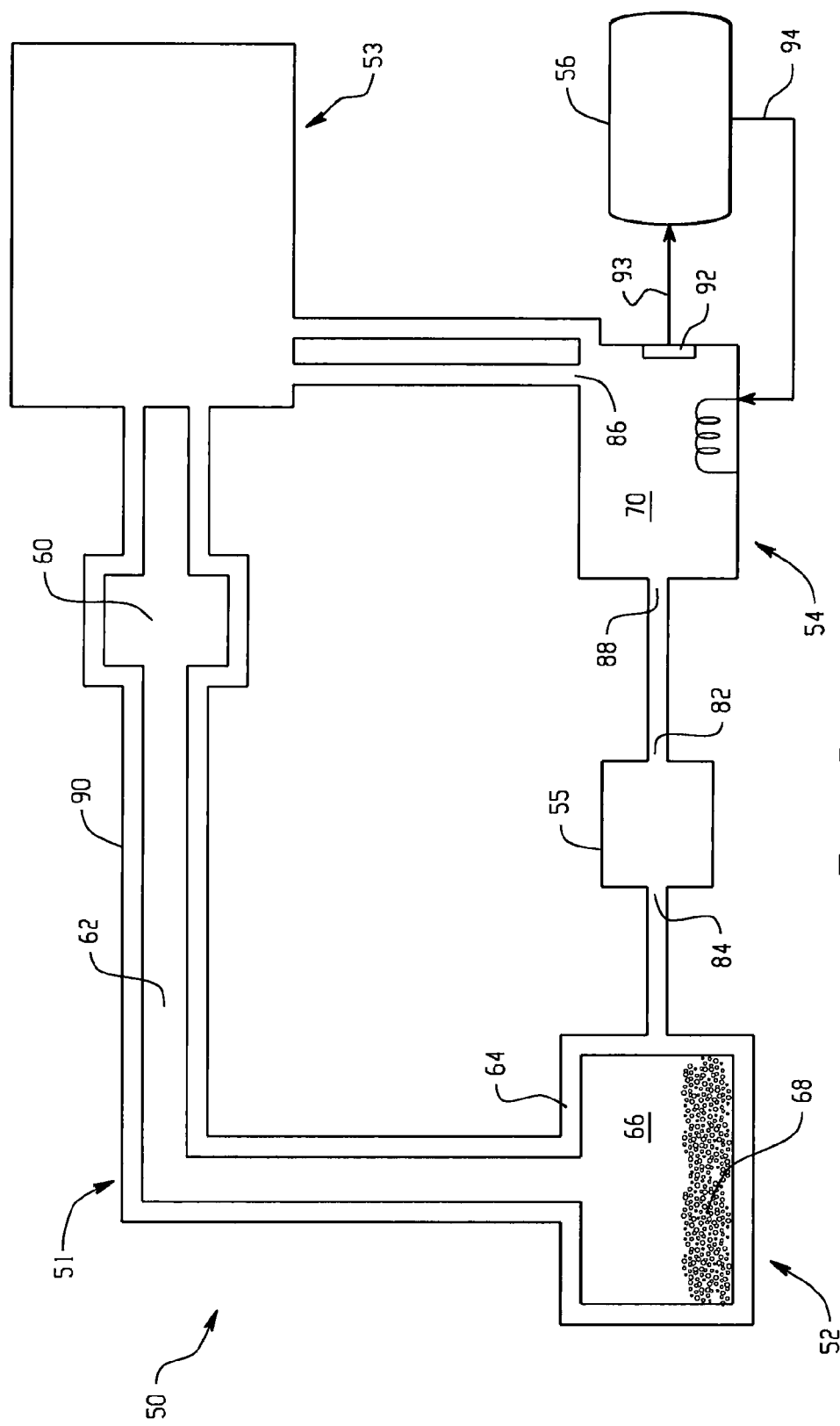
FIG. 5 schematically illustrates a partial cross sectional view of a single plasma ion source for an ion implantation device suitable for practicing the method in accordance with the present disclosure.

The ion source for generating the ion beam can be a single plasma ion source or a dual plasma ion source. Likewise, the ion sources can be an indirectly heated cathode ion source or one that generates ions by exposure to radiofrequency (RF) energy. FIG. 5 schematically illustrates an exemplary single plasma ion source 50 suitable for practicing the method and is generally disclosed in U.S. Pat. No. 6,479,828 to Perel, the contents of which are incorporated by reference in its entirety. The single plasma ion source 50 includes a vaporizer 51 and an ionizer 53. The vaporizer 51 comprises a non-reactive, thermally conductive sublimator or crucible 52, a heating medium reservoir 54, a heating medium pump 55, a temperature controller 56, and a mass flow controller 60. The crucible 52 is located remotely from the ionizer 53 and connected thereto by a feed tube 62, constructed of quartz or stainless steel that is surrounded by an outer single-chamber annular sheath 90 along substantially the entire length thereof.

The crucible 52 provides a container 64 enclosing a cavity 66 for containing a source material 68. The container is preferably made of a suitable non-reactive (inert) material such as stainless steel, graphite, quartz or boron nitride and which is capable of holding a sufficient amount of source material 68.

The silaborane molecule can exist in liquid or powder form and can be vaporized by heating the walls of the container 64 with a heating medium 70 contained in reservoir 54. For example, a solid silaborane molecule can be heated to sublimation in order to achieve the pressure necessary for vapor transport, typically greater than 1 mTorr. Completely vaporized silaborane molecules exit the crucible 52 via feed tube 62 and enters mass flow controller 60, which controls the flow of vapor, and thus meters the amount of vaporized silaborane molecule that is provided to the ionizer 53.

Alternatively, the feed tube 62 is provided in the form of a capillary tube and sheath 90 is provided in the form of a coaxial dual-chamber sheath, comprising an inner sheath surrounded by an outer sheath. The heating medium may be pumped into the inner sheath (located adjacent the capillary tube 62) and pumped out of the outer sheath (located radially outward from the inner sheath). In this second embodiment, the mass flow controller 60 may be replaced with a heated shut-off valve (not shown) located at the feed tube/ionizer interface, and mass flow is increased or decreased by directly changing the temperature of the reservoir 54.

Figure 6:
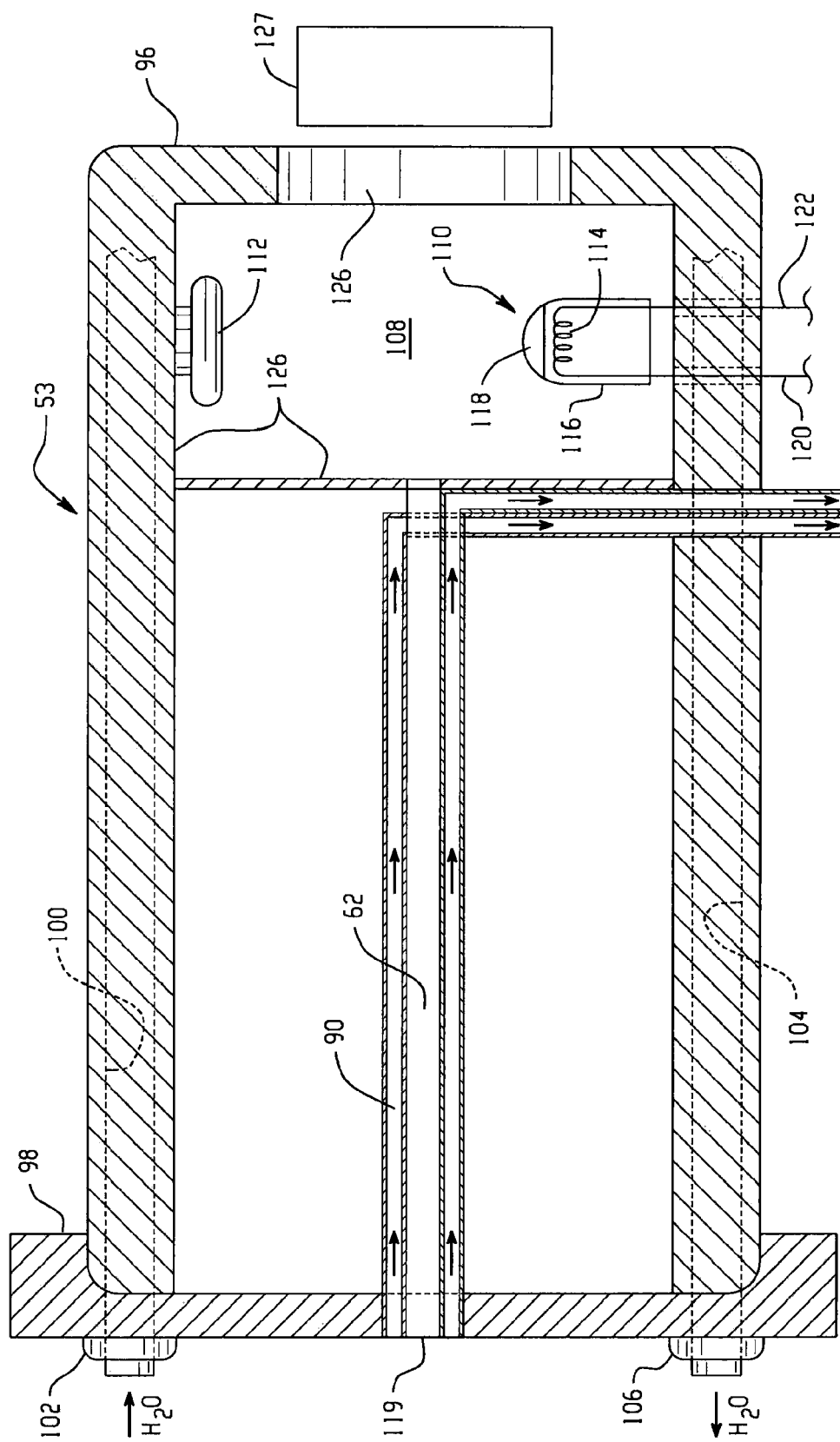
FIG. 6 schematically illustrates a partial cross section view of the ionizer portion of the ion implantation device of FIG. 5.

An exemplary ionizer 53 is shown in more detail in FIG. 6. In this particular example, the ionizer 53 comprises a generally cylindrical body 96 and a generally annular base or mounting flange 98, both in the preferred embodiment constructed of aluminum. The body 96 is cooled by means of entry cooling passageway 100 fed by inlet 102 and exit cooling passageway 104 which exits body 96 via outlet 106. The cooling medium may be water or any other suitable fluid having high heat capacity. The entry and exit cooling passageways provide a continuous pathway by which water flows therethrough to cool the ionizer body 96. Although only a fragmented portion of the pathway is shown in phantom in FIG. 6, the pathway may extend near and about the outer periphery of the body in any known configuration to insure that the entire body is effectively cooled.

Cooling the body 96 insures that the ionization chamber 108 resides at temperatures that will accommodate the silaborane molecule pressure within the ionization chamber and is sufficiently high.

Within the confines of the ionizer body 96 are an extension of the feed tube 62, surrounded by annular sheath 90, terminating at ionization chamber 108. Within the ionization chamber resides a hot cathode 110 and an anti-cathode or repeller 112. The hot cathode 110 comprises a heated tungsten filament 114 surrounded by a molybdenum cylinder 116 and capped by tungsten end cap 118. The heated filament 114 is energized via power feedthroughs 120 and 122 that pass through and are electrically insulated from the body 96. The repeller 112 is also electrically insulated from the body 96, via a thermally conductive electrically insulating material (such as sapphire) which physically couples the repeller to the cooled ionization chamber 108.

In operation, the vaporized silaborane molecule is injected into the ionization chamber via feed tube 62 at ionizer inlet 119. When the tungsten filament 114 is energized electrically by application of a potential difference across feedthroughs 120 and 122, the filament emits electrons that accelerate toward and impact end cap 118. When the end cap 118 is sufficiently heated by electron bombardment, it in turn emits electrons into the ionization chamber 108 that strike the vaporized silaborane molecules to create ions in the chamber. Depending on the conditions, fragmentation of the molecule can also be made to occur.

A low-density ion plasma is thereby created, from which an ion beam is extracted from the chamber through source aperture 126. The plasma includes the various ionized silaborane species, all of which are selectively implantable into a workpiece. The extracted ion beam is then mass analyzed by mass analysis magnet 127 to permit only ions having a prescribed charge-to-mass ratio to pass therethrough. The low density of the ionized silaborane molecule plasma in chamber 108 is in part provided by the relatively low arc discharge power maintained in the source.

Using the single plasma ion source 50 of FIG. 5 in an ion implantation device, an entire silaborane molecule (greater than 5 boron atoms), or its fragmented lower mass byproducts can be selectively implanted into the work piece. The silaborane molecule breaks up at the work piece surface such that the energy of each boron atom is a fraction of the silaborane molecule or lower mass byproduct. For example, in the case of o-silaborane, the energy of each atom is roughly one-tenth the energy of the ten borons in o-silaborane. Thus, the beam can be transported at multiple times the desired boron implantation energy, enabling very shallow implants without significant beam transmission losses. In addition, because the charge per unit molecule is a fraction of a monatomic beam implant, workpiece charging problems are much less severe for a given dose rate.

The mass analysis magnet 127 can be adjusted, as is known in the art, to permit to pass therethrough only particles having a charge-to-mass ratio within a specific range. The mass analysis magnet can create a dipole magnetic field to deflect various ions in an ion beam via magnetic deflection in an arcuate passageway that will effectively separate ions of different charge-to-mass ratios.

Electrons generated by cathode 110 which do not strike a silaborane molecule in the ionization chamber to create ionized silaborane molecule and its fragmented lower mass ions move toward the repeller 112, which deflects these electrons back toward the cathode. The repeller is preferably constructed of molybdenum and, like the cathode, is electrically insulated from the ionizer body 96. Walls 128 of the ionization chamber 108 are maintained at local electrical ground potential. The cathode 110, including end cap 118, is maintained at a potential of approximately 50 to 150 volts below the potential of the walls 128. The filament 114 is maintained at a voltage approximately between 200 and 600 volts below the potential of the end cap 118. The large voltage difference between the filament 114 and the end cap 118 imparts a high energy to the electrons emitted from the filament to sufficiently heat end cap 118 to terminologically emit electrons into the ionization chamber 108.

The single plasma ion source 50 provides a control mechanism for controlling the operating temperature of the crucible 52, as well as that of the feed tube 62 through which vaporized silaborane molecule passes on its way to and through the ionizer 53. The heating medium 70 is heated within the reservoir 54 by a resistive or similar heating element 80 and cooled by a heat exchanger. The temperature control means comprises a temperature controller 56 which obtains as an input temperature feedback from the reservoir 54 via thermocouple 92, and outputs a control signal to heating element 80, as further described below, so that the heating medium 70 in the reservoir is heated to a suitable temperature.

The heating medium 70 comprises mineral oil or other suitable medium (e.g., water) that provides a high heat capacity. The oil is heated to a temperature within the 20° C. to 250° C. range by the heating element 80 and circulated by pump 55 around the crucible 52 and the feed tube 62 through sheath 90. The pump 55 is provided with an inlet and an outlet 82 and 84, respectively, and the reservoir 54 is similarly provided with an inlet 86 and an outlet 88, respectively. The flow pattern of the heating medium about the crucible 52 and the feed tube 62, may be any pattern that provides reasonable circulation of the medium about the crucible 52 and the feed tube 62.

Referring back to FIG. 4 the crucible cavity 66 can be pressurized in order to facilitate material transfer of the vaporized silaborane molecule from the crucible 52 to the ionization chamber 108 through the feed tube 62. As the pressure within cavity 66 is raised, the rate of material transfer correspondingly increases. The ionization chamber operates at a near vacuum (about 1 millitorr), and thus, a pressure gradient exists along the entire length of the feed tube 62, from the crucible 52 to the ionization chamber 108. The pressure of the crucible is typically on the order of 1 torr.

By locating the crucible 52 remotely from the ionization chamber 108, the material within crucible cavity 66 is thermally isolated, thereby providing a thermally stable environment unaffected by the temperature in the ionization chamber. As such, the temperature of the crucible cavity 66, in which the process of sublimation occurs, may be controlled independently of the operating temperature of the ionization chamber 108 to a high degree of accuracy (within 1° C.). Also, by maintaining a constant temperature of the vaporized silaborane molecule during transport to the ionization chamber via the heated feed tube 62, no condensation or thermal decomposition of the vapor occurs.

The temperature controller 56 controls the temperature of the crucible 52 and the feed tube 62 by controlling the operation of the heating element 80 for the heating medium reservoir 70. Thermocouple 92 senses the temperature of the reservoir 70 and sends temperature feedback signal 93 to the temperature controller 56. The temperature controller responds to this input feedback signal in a known manner by outputting control signal 94 to the reservoir heating element 80. In this manner, a uniform temperature is provided for all surfaces to which the silaborane molecules are exposed, up to the location of the ionization chamber.

By controlling the circulation of the heating medium in the system (via pump 55) and the temperature of the heating medium (via heating element 80), the ion source 50 can be controlled to an operating temperature of on the order of 20° C. to 250° C. (+/−1° C.). Precise temperature control is more critical at the crucible, as compared to the end of the feed tube nearest the ionization chamber, to control the pressure of the crucible and thus the vapor flow rates out of the crucible.

Heating the crucible can also be achieved with contact resistive heaters or any other manner of heating. Precise control of this temperature determines the pressure of the Silaborane vapor.

Figure 7:
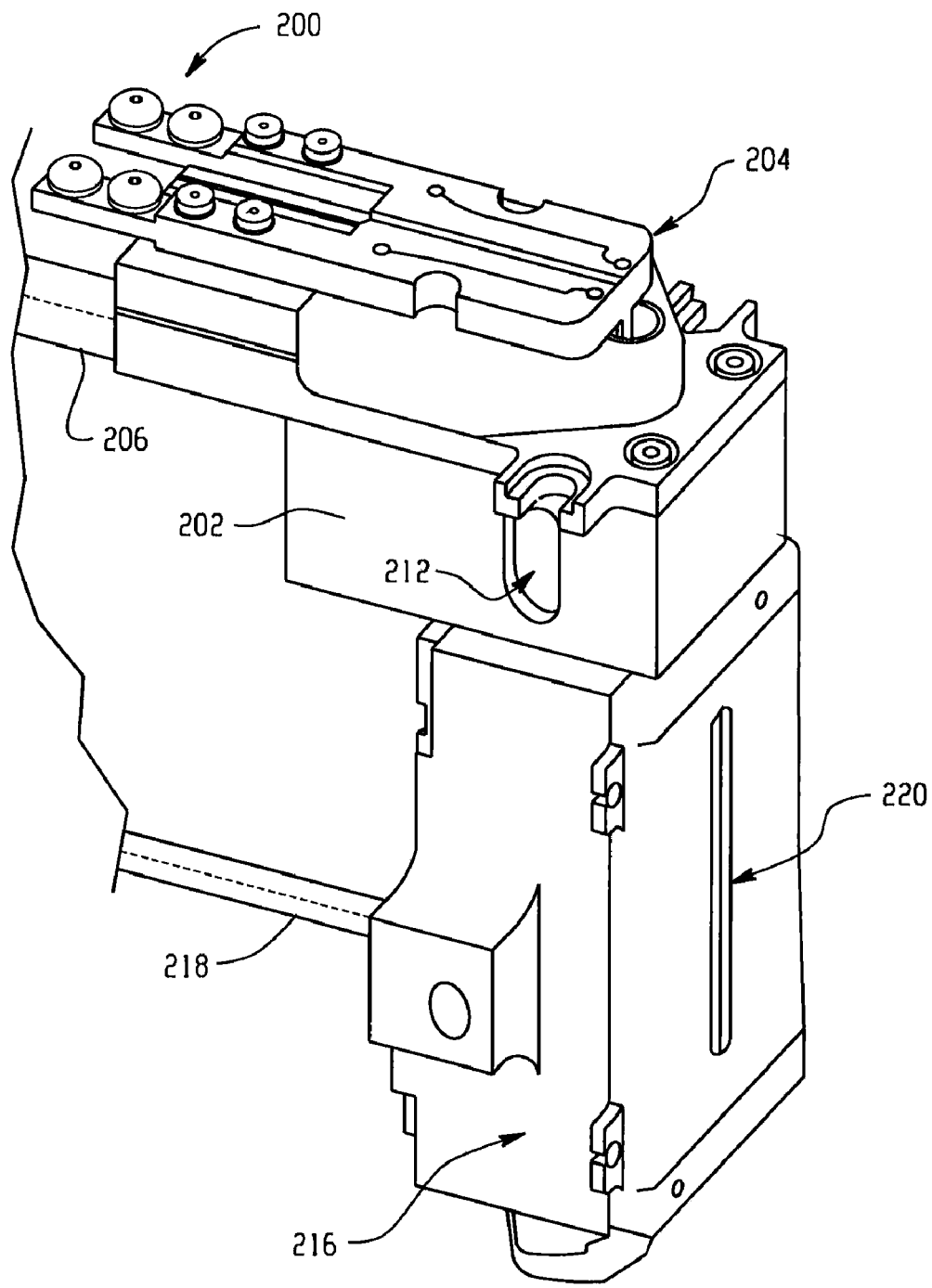
FIG. 7 schematically illustrates an isometric view of a dual plasma ion source for an ion implantation device suitable for practicing the method in accordance with the present disclosure.
Figure 8:
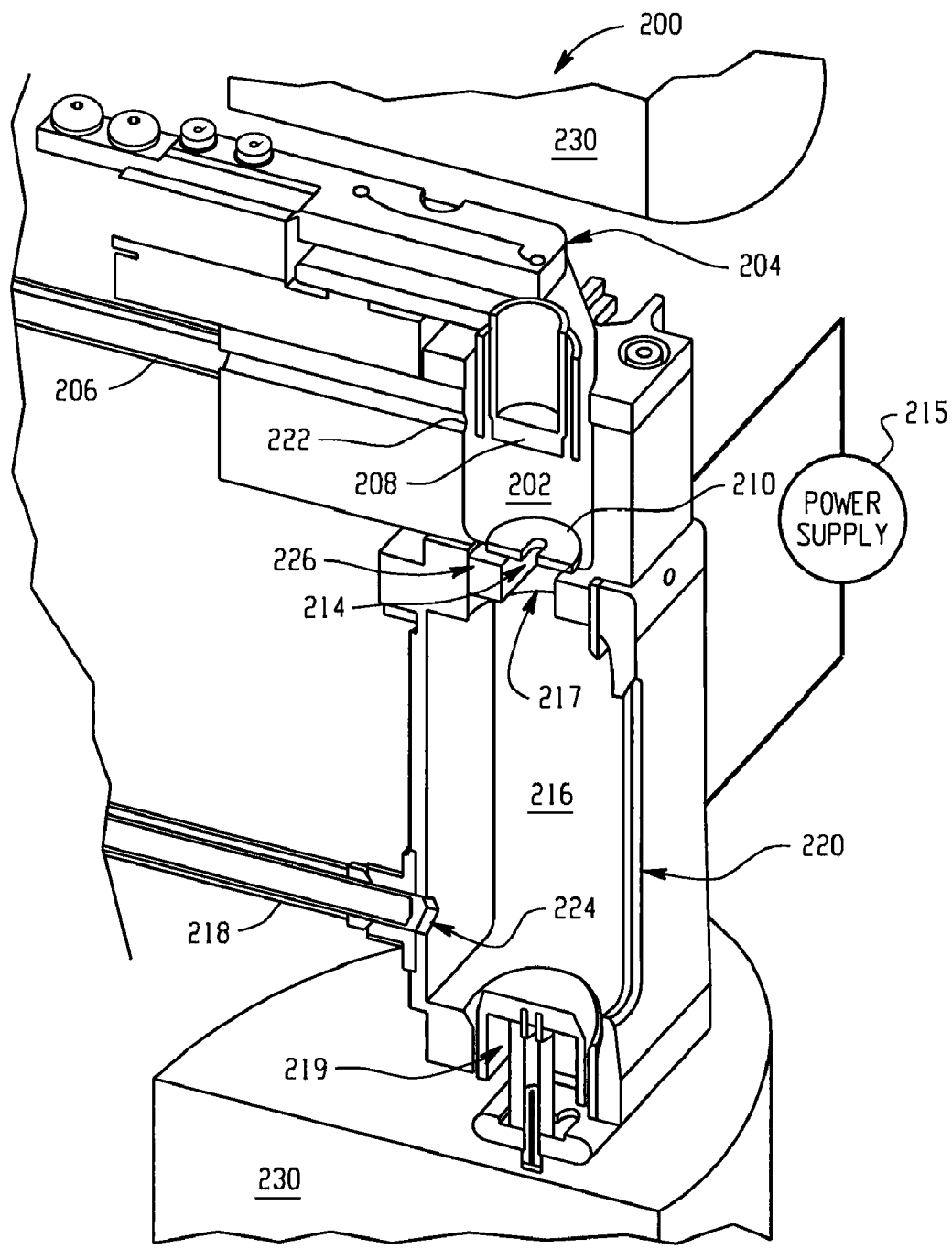
FIG. 8 schematically illustrates a cross sectional perspective view of a dual plasma ion source for an ion implantation device suitable for practicing the method in accordance with the present disclosure.

FIGS. 7 and 8 illustrate a simplified exemplary dual plasma ion source 200, wherein the dual plasma ion source 200 is suitable for implanting the silaborane molecules. It should be noted that the dual plasma ion source 200 depicted in FIGS. 7 and 8 is provided for illustrative purposes and is not intended to include all aspects, components, and features of an ion source.

The dual plasma ion source 200, for example, comprises a first plasma chamber 202 situated adjacent a second plasma chamber 216. The first plasma chamber 202 includes a gas source supply line 206 and is a configured with a plasma generating component 204 for creating plasma from a first source gas. A source gas is introduced into the first plasma chamber 202 by a gas supply line 206. The source gas can comprise at least one of the following: inert gases such as argon (Ar) and xenon (Xe), standard ion implantation gases such as boron trifluoride ($BF_3$), arsene ($AsH_3$) and phosphene ($PH_3$), and reactive gases such as oxygen ($O_2$) and nitrogen trifluoride ($NF_3$). It should be understood that the foregoing list of source gases is provided for illustrative purposes only, and shall not be considered to represent a complete list of the source gases that could be delivered to the first plasma chamber.

The plasma generating component 204 can comprise a cathode 208/anode 210 combination, wherein the cathode 208 may include a simple Bernas-type filament configuration, or an indirectly heated cathode. Alternatively, the plasma generating component 204 may include an RF induction coil antenna that is supported having a radio frequency conducting segment mounted directly within a gas confinement chamber to deliver ionizing energy into the gas ionization zone, for example, as disclosed in commonly assigned U.S. Pat. No. 5,661,308.

The first, or electron source, plasma chamber 202 defines an aperture 212 forming a passageway into a high vacuum region of an ion implantation system, i.e. a region wherein pressure is much lower than the pressure of the source gas in the first plasma chamber 202. The aperture 212 provides a pumping aperture for maintaining source gas purity at a high level, as will be further discussed herein below.

The electron source plasma chamber 202 also defines an aperture 214 forming an extraction aperture for extracting electrons from the electron source plasma chamber 202. In one embodiment, the extraction aperture 214 is provided in the form of a replaceable anode element 210 as illustrated in FIG. 7, having an aperture 214 formed therein. As such, it will be recognized by those of skill in the art that the electron source plasma chamber 202 can be configured to have a positively biased electrode 219 (relative to the cathode 208) for attracting electrons from the plasma in a so-called non-reflex mode. Alternatively, the electrode 219 can be biased negatively relative to the cathode 208 to cause electrons to be repelled back into the electron source plasma chamber 202 in a so-called reflex mode. It will be understood that this reflex mode configuration would require proper biasing of the plasma chamber walls, together with electrical insulation and independent biasing of the electrode 219.

As previously stated, the dual plasma ion source 200 also includes a second, or ion source chamber 216. The second ion source plasma chamber 216 includes a second gas source supply line 218 for introducing a source gas into the ion source plasma chamber 216 and is further configured to receive electrons from the electron source plasma chamber 202, thereby creating plasma therein via the collisions between the electrons and the second source gas. The second source gas comprises the silaborane molecule.

The second, or ion source, plasma chamber 216 defines an aperture 217 aligned with the extraction aperture 214 of the first plasma chamber 202, forming a passageway therebetween for permitting electrons extracted from the first plasma chamber 202 to flow into the second plasma chamber 216. Preferably, the ion source plasma chamber 216 is configured to have a positively biased electrode 219 for attracting electrons injected into the ion source plasma chamber 216 in a so-called non-reflex mode to create the desired collisions between electrons and gas molecules to create ionization plasma. Alternatively, the electrode 219 can be biased negatively to cause electrons to be repelled back into the ion source plasma chamber 216 in a so-called reflex mode.

An extraction aperture 220 is configured in the second plasma chamber 216 to extract ions for formation of an ion beam for implantation in the usual manner.

In one embodiment, the second plasma chamber 216 is biased positively with respect to the first plasma chamber 202 utilizing an external bias power supply 215. Electrons are thus extracted from the electron source plasma chamber 202 and injected into the ion source plasma chamber 216 where collisions are induced in the second plasma chamber 216 between the electrons provided by the first plasma chamber 202 and the silaborane molecule supplied to the second plasma chamber 216 via the second gas source supply line 218, to create a plasma.

It should be noted that the first plasma chamber 202 and the second plasma chamber 216 can have three open boundaries: a gas inlet (e.g., a first gas supply inlet 222 and a second gas supply inlet 224), an opening to a high vacuum area (e.g., pumping aperture 212 and extraction aperture 220) and a common boundary apertures 214 and 217 forming the common passageway between the first and second plasma chambers, 202 and 204, respectively. Preferably, the area of the common boundary apertures 214 and 217 is kept small compared to the apertures 212 and 220 into the high vacuum region, i.e., first plasma chamber aperture 212 and second plasma chamber aperture 220.

In one exemplary dual plasma ion source configuration, the ion source comprises components of a standard indirectly heated cathode (IHC) ion source of the type manufactured and sold by Axcelis Technologies, Inc., of Beverly, Mass., wherein the ion source plasma chamber includes a standard arc chamber, configured with a standard anode, extraction system and source feed tube. The internally heated cathode element of the standard IHC source is removed and replaced with a small electron source plasma chamber mounted in its place, which contains components similar to a standard IHC ion source of the type manufactured and sold by Axcelis Technologies, Inc., including an arc chamber, a standard internally heated cathode element and a source feed tube.

Both plasma chambers can also share a magnetic field oriented along the extraction aperture, provided by a standard source magnet available from Axcelis Technologies, Inc., depicted by reference numeral 230. It is well known that the ionization process (and in this case the electron generating process) becomes more efficient by inducing a vertical magnetic field in the plasma generating chamber. As such, in a preferred embodiment electromagnet members 230 are positioned outside of the first and second plasma chambers, 202 and 216 respectively, preferably along the axis of the shared boundary therebetween. These electromagnet elements 230 induce a magnetic field that traps the electrons to improve the efficiency of the ionization process.

The electron source chamber 202 is preferably thermally isolated from the ion source plasma chamber 216 via an insulative member 226 positioned therebetween, with the only power coupled to the ion source plasma chamber 216 being a small amount of radiative power, typically on the order of 10 W, provided from the cathode 108 through the common boundary aperture formed by apertures 214, 217, and the discharge power associated with the electron current injected into the ion source plasma chamber 266, typically 10 W. The low amount of power coupled to the ion source plasma chamber 216 facilitates maintaining the wall temperatures low enough to prevent dissociation of large molecule gases. The electron source chamber 202 is electrically isolated from the ion source plasma chamber 216 by the insulative member 226.

In one embodiment, the ion source plasma chamber 216 is configured with an extraction aperture 220 having an area of approximately 300 mm$^2$ (5 mm×60 mm) The electron source chamber 202 is also configured with a pumping aperture 212 of total area 300 mm$^2$ The common boundary aperture formed by apertures 214 and 217 shared by the two plasma chambers preferably has an area on the order of 30 mm$^2$ (4 mm×7.5 mm).

As previously noted, the choice of the areas of the electron source plasma chamber pumping aperture 212 and ion source plasma chamber extraction aperture 220, is preferably large compared to the common boundary aperture created by apertures 214 and 217, which results in relatively high gas purity in each chamber, 202 and 216. In a typical application, gas density in the electron source plasma chamber 202 and second vaporized silaborane molecule density in the ion source plasma chamber 216 are approximately equal such that each plasma chamber gas is about 90% pure.

Figure 9:
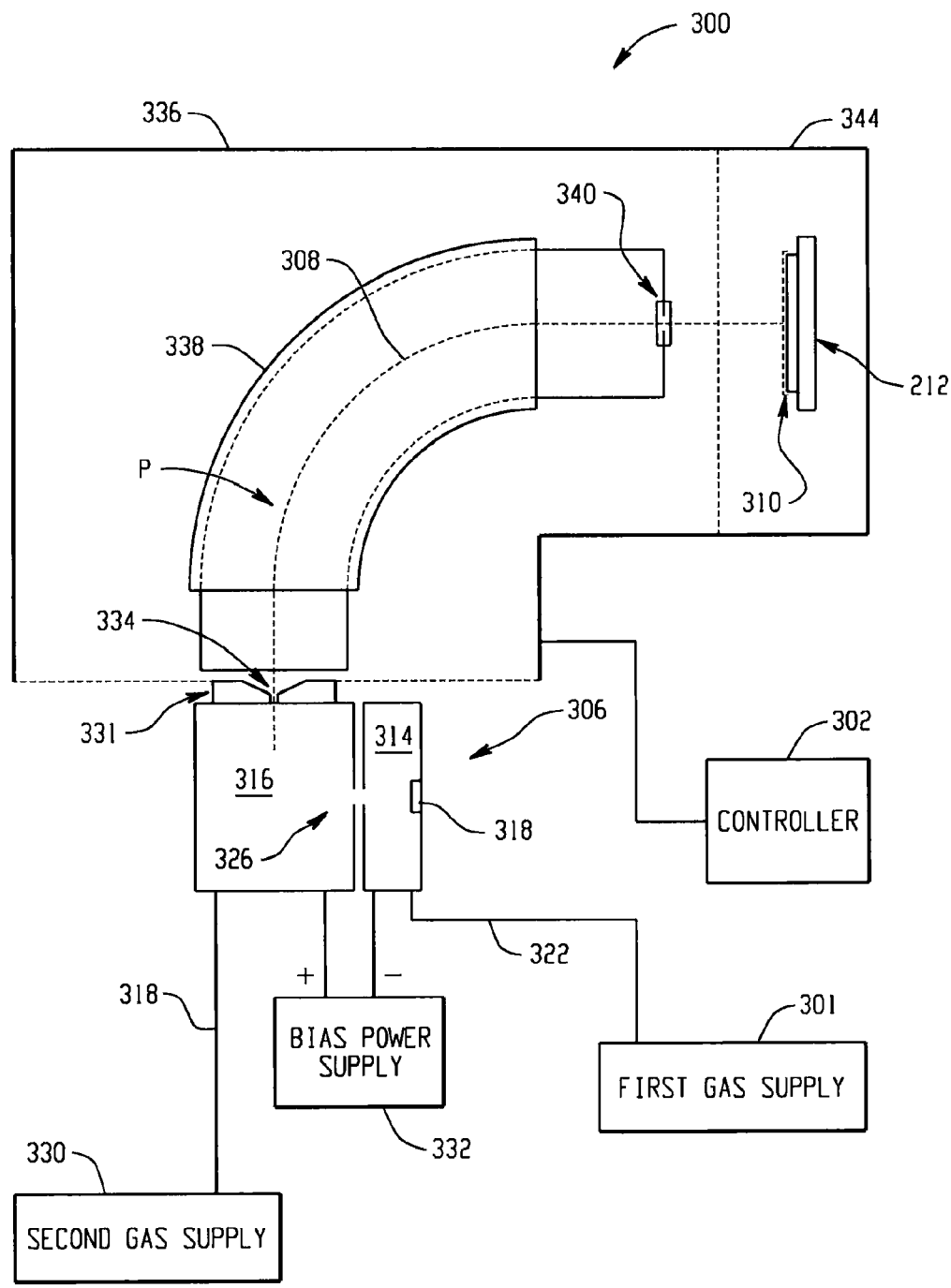
FIG. 9 schematically illustrates an exemplary ion implantation device utilizing a dual plasma ion source.

FIG. 9 schematically illustrates an exemplary ion implantation device 300 utilizing a dual plasma ion source such as the one described above. The ion implantation apparatus 300 (also referred to as an ion implanter) is operably coupled to a controller 302 for controlling the various operations and processes implemented on the ion implantation apparatus 300. The ion implantation apparatus 300 includes the double plasma ion source assembly 306 described hereinabove for producing a quantity of ions for generating an ion beam 308 traveling along an ion beam path P, for implantation of the ions to a workpiece 310 (e.g., a semiconductor workpiece, display panel, etc.) held on a workpiece support platen 312.

The ion source assembly 306, comprises a first plasma chamber 314 (e.g., a plasma chamber or arc chamber) and a second plasma chamber 316, wherein the first plasma chamber 314 is configured with a plasma generating component 318, which can include a cathode 108 (see FIG. 6) and an anode 110 (see FIG. 6) for generating a plasma from a first gas introduced into the first plasma chamber 314 via a first gas feed line 322 from a first gas supply 301. The plasma generating component 318 can in the alternative comprise an RF induction coil, for example. The first gas can comprise at least one of the following: inert gases such as argon (Ar) and xenon (Xe), standard ion implantation gases such as boron trifluoride ($BF_3$), arsene ($AsH_3$) and phosphene ($PH_3$), and reactive gases such as oxygen ($O_2$) and nitrogen trifluoride ($NF_3$).

A second plasma chamber 316 is situated in fluid communication with the first plasma chamber 314 via a common boundary aperture 326 formed between the first and second plasma chambers, 314 and 316, wherein the second plasma chamber 316 contains a second gas introduced by a second gas feed line 328 from a second gas supply 320. The second gas comprises vaporized silaborane molecule.

The second plasma chamber 316 is preferably biased positive with respect to the first plasma chamber 314 by a bias power supply 332, enabling the extraction of electrons from the first plasma chamber 314 for injection into the second plasma chamber 316. When the extracted electrons collide with the second gas in the second plasma chamber 316 they create plasma in the second plasma chamber 316. An extraction aperture 334 is provided in the second plasma chamber 316 to extract ions from the plasma formed therein the second plasma chamber 316.

The ion implantation system 300 further comprises an extraction electrode assembly 331 associated with source assembly 306, wherein the extraction electrode assembly 331 is biased to attract charged ions from the source assembly 306 for extraction through the extraction aperture. A beamline assembly 336 is further provided downstream of the ion source assembly 306, wherein the beamline assembly 336 generally receives the charged ions from the source 306. The beam line assembly 336, for example, comprises a beam guide 342, a mass analyzer 338, and a resolving aperture 340, wherein the beam line assembly 336 is operable to transport the ions along the ion beam path P for implantation into workpiece 310.

The mass analyzer 338, for example, further comprises a field generating component, such as a magnet (not shown), wherein the mass analyzer 338 generally provides a magnetic field across the ion beam 308, thus deflecting ions from the ion beam 308 at varying trajectories according to a charge to mass ratio associated with the ions extracted from the source 306. For example, ions traveling through the magnetic field experience a force that directs individual ions of a desired charge to mass ratio along the beam path P and deflects ions of undesired charge to mass ratios away from the beam path P. Once through the mass analyzer 338, the ion beam 308 is directed though a resolving aperture 340, wherein the ion beam 308 may be accelerated, decelerated, focused or otherwise modified for implantation into the workpiece 310 positioned within an end station 344.

As a result of the foregoing single and dual plasma ion source hardware configurations, the formation of silaborane molecule ion species and its fragmented lower mass byproducts are within a second plasma chamber 216 utilizing electrons from the first plasma chamber 202 can avoid the typical ion source contamination problems associated with a cathode, for example, while the power dissipation attributes of such hardware can enable a wide range of electron current ionization applications typically associated with molecular species ionization, as well as high electron current ionization applications typically associated with monomer species ionization.

Typical ion energies are in the range of 1 to 500 keV (160 to 80,000 aJ). Energies below 1 keV (160 aJ) can be used, but result in a penetration of only a few nanometers or less. Higher energies can also be used: accelerators capable of 5 MeV (800,000 aJ) are common. However, there is often great structural damage to the target, and because the depth distribution is broad, the net composition change at any point in the target will be small.

The energy of the ions, as well as the ion species and the composition of the target determine the depth of penetration of the ions in the solid: a monoenergetic ion beam will generally have a broad depth distribution. The average penetration depth is called the range of the ions. Under typical circumstances ion ranges will be between 10 nanometers and 1 micrometer. Thus, ion implantation is especially useful in cases where the chemical or structural change is desired to be near the surface of the target. Ions gradually lose their energy as they travel through the solid, both from occasional collisions with target atoms (which cause abrupt energy transfers) and from a mild drag from overlap of electron orbitals, which is a continuous process. The loss of ion energy in the target is called stopping.

Each individual ion produces many point defects in the target crystal on impact such as vacancies and interstitials. Vacancies are crystal lattice points unoccupied by an atom: in this case the ion collides with a target atom, resulting in transfer of a significant amount of energy to the target atom such that it leaves its crystal site. This target atom then itself becomes a projectile in the solid, and can cause successive collision events. Interstitials result when such atoms (or the original ion itself) come to rest in the solid, but find no vacant space in the lattice to reside. These point defects can migrate and cluster with each other, resulting in dislocation loops and other defects.

Because ion implantation causes damage to the crystal structure of the target which is often unwanted, ion implantation processing is often followed by a thermal annealing. This can be referred to as damage recovery.

The foregoing descriptions of the preferred embodiments of the disclosure have been presented for purposes of illustration and description. It is not intended to be exhaustive or to limit the disclosure to the precise forms disclosed. Obvious modifications or variations are possible in light of the above teachings. The embodiments were chosen and described to provide the best illustration of the principles of the disclosure and its practical applications to thereby enable one of ordinary skill in the art to utilize the disclosure in various embodiments and with various modifications as are suited to the particular use contemplated. All such modifications and variations are within the scope of the disclosure as determined by the appended claims when interpreted in accordance with the breadth to which they are fairly, legally and equitably entitled.

The invention claimed is:

1. A process for implanting silaborane molecules, the process comprising:
vaporizing and ionizing silaborane molecules in an ion source to create a plasma and produce ionized silaborane molecules and ionized lower mass byproducts, wherein the silaborane molecules comprise an icosahedral structure;
extracting the ionized silaborane molecules and ionized lower mass byproducts within the plasma through a source aperture to form an ion beam;

mass analyzing the ion beam with a mass analyzer magnet to permit the ionized silaborane molecules or a selected ionized mass of the lower mass byproducts to pass therethrough;

transporting the ion beam and/or optionally applying additional acceleration or deceleration potentials to set the final energy; and implanting the ionized silaborane molecules or the selected ionized mass of the lower mass byproducts into a workpiece.

2. The process of claim 1, wherein the silaborane molecule comprises a o-silaborane molecule.

3. The process of claim 1, wherein the silaborane molecule comprises a 1,2 dimethyl 1,2 disila closo dodecaborane molecule.

4. The process of claim 1, wherein the silaborane molecule comprises an icosahedral silaborane molecule having the formula: $B_nH_nSi_{12-n}R_{12-n}$, where R is an atom or compound bound to the silicon atoms and n is an integer.

5. The process of claim 4, wherein R is a hydrogen atom, methyl group, ethyl group, phenyl group, or a combination comprising one of the foregoing.

6. The process of claim 1, wherein the silaborane molecule has greater than 5 boron atoms.

7. The process of claim 1, wherein implanting the ionized silaborane molecules or the selected ionized mass of the lower mass byproducts into a workpiece comprises forming a spot beam and mechanically scanning the workpiece in at least one dimension, wherein the spot beam is orthogonal to the workpiece.

8. The process of claim 1, wherein implanting the ionized silaborane molecules or the selected ionized mass of the lower mass byproducts into a workpiece comprises forming a ribbon beam and mechanically scanning the workpiece in an orthogonal direction.

9. The process of claim 1, wherein implanting the silaborane molecules or the selected ionized mass of the lower mass byproducts into a workpiece comprises electromagnetically or electrostatically scanning the ion beam across the workpiece, with a second mechanical axis in the orthogonal direction.

10. The process of claim 1, wherein the ion source is an indirectly heated cathode ion source.

11. The process of claim 1, wherein the ion source is a dual plasma ion source.

12. The process of claim 1, wherein the ion source is a single plasma ion source.

13. The process of claim 1, wherein the ion source is a radio frequency ion source.

14. The process of claim 1, wherein vaporizing and ionizing the silaborane molecules in the ion source comprises vaporizing the silaborane molecules and ionizing the vaporized silaborane molecules in an ionizer.

15. The process of claim 1, wherein vaporizing and ionizing the silaborane molecules in the ion source comprises generating a first plasma from a first gas; extracting electrons from the first plasma; and reacting the electrons with the vaporized silaborane molecules to form a second plasma comprising the ionized silaborane molecules and ionized lower mass byproducts.

16. The process of claim 15, wherein the first gas comprises argon, xenon, argon boron trifluoride, arsene, phosphene, oxygen, nitrogen trifluoride or combinations thereof.

17. A process for implanting boron atoms into a work piece, the process comprising:

vaporizing a silaborane molecule, wherein the silaborane molecule comprises an icosahedral structure;

ionizing the silaborane molecule and extracting ions from an ion source to form an ion beam;

transporting drift of the ion beam and/or optionally applying additional acceleration or deceleration potentials to set the final energy; and implanting selected ions having a desired charge to mass ratio into the work piece, wherein the selected ions decompose into the boron atoms.

18. The process of claim 17, wherein implanting the selected ions comprises mass analyzing the extracted ions to selectively implant ions having the desired charge to mass ratio.

19. The process of claim 17, wherein the ion source is a dual plasma ion source.

20. The process of claim 17, wherein the ion source is a single plasma ion source.

21. The process of claim 17, wherein the ion source is a radio frequency derived ion source.

* * * * *